US011205686B2

(12) United States Patent
Song

(10) Patent No.: US 11,205,686 B2
(45) Date of Patent: Dec. 21, 2021

(54) DISPLAY SUBSTRATE, PREPARATION METHOD OF DISPLAY SUBSTRATE AND DISPLAY DEVICE

(71) Applicant: BOE Technology Group Co., Ltd., Beijing (CN)

(72) Inventor: Yingying Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 29 days.

(21) Appl. No.: 16/416,354

(22) Filed: May 20, 2019

(65) Prior Publication Data

US 2020/0066814 A1 Feb. 27, 2020

(30) Foreign Application Priority Data

Aug. 24, 2018 (CN) .......................... 201810973772.1

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 27/3283* (2013.01); *H01L 51/0005* (2013.01); *H01L 51/0035* (2013.01); *H01L 51/56* (2013.01); *H01L 2227/323* (2013.01); *H01L 2251/5369* (2013.01)

(58) Field of Classification Search
CPC ............. H01L 27/3246; H01L 27/3283; H01L 51/0005; H01L 51/0035; H01L 51/56; H01L 2227/323; H01L 2251/5369; C09K 2323/00
See application file for complete search history.

(56) References Cited

U.S. PATENT DOCUMENTS

| 2006/0009133 | A1* | 1/2006 | Hashimoto ......... H01L 27/3246 451/29 |
| 2011/0111292 | A1* | 5/2011 | Kwon ..................... H01M 4/13 429/209 |
| 2012/0293484 | A1* | 11/2012 | Matsuoka ............ G02B 26/005 345/212 |
| 2013/0222879 | A1* | 8/2013 | Kuo ..................... G02B 26/005 359/290 |
| 2017/0194395 | A1 | 7/2017 | Hu et al. |
| 2017/0213880 | A1 | 7/2017 | Nendai et al. |
| 2019/0103449 | A1 | 4/2019 | Hou |

FOREIGN PATENT DOCUMENTS

| CN | 105448957 A | 3/2016 |
| CN | 105826358 A | 8/2016 |
| CN | 107623022 A | 1/2018 |
| CN | 107689427 A | 2/2018 |

OTHER PUBLICATIONS

Chinese Office Action for corresponding application 201810973772.1 dated Apr. 2, 2020.

* cited by examiner

*Primary Examiner* — Anthony J Frost
(74) *Attorney, Agent, or Firm* — Arent Fox LLP; Michael Fainberg

(57) ABSTRACT

The disclosure relates to a display substrate, a preparation method of the display substrate and a display device. A contact angle of a material, for defining long sides of pixel regions, of a pixel defining layer is larger than a contact angle of a material, for defining short sides of the pixel regions, of the pixel defining layer.

11 Claims, 5 Drawing Sheets

DISPLAY SUBSTRATE, PREPARATION METHOD OF DISPLAY SUBSTRATE AND DISPLAY DEVICE

CROSS-REFERENCE TO RELATED APPLICATION

This application claims priority of Chinese Patent Application No. 201810973772.1, filed on Aug. 24, 2018, which is hereby incorporated by reference in its entirety.

TECHNICAL FIELD

The disclosure relates to the technical field of display, in particular to a display substrate, a preparation method of the display substrate and a display device.

BACKGROUND

Compared with a liquid crystal display, an organic electroluminescence device (OLED) has the advantages of self-luminescence, fast response, wide viewing angle, high brightness, brilliant color and good portability, and is considered as the next generation of display technology.

The film forming methods of OLED mainly include an evaporation process and a solution process. The evaporation process is mature in small-size applications. At present, the technology has been applied to mass production. Solution processing methods mainly include ink jet printing, nozzle coating, spin coating and screen printing, wherein the ink jet printing technology is considered as an important way to realize mass production of large-size OLED due to a high material utilization rate and a capability to realize large sizes.

SUMMARY

The display substrate provided by some embodiments of the present disclosure includes a base substrate and a pixel defining layer located on the base substrate, and pixel regions defined by the pixel defining layer have long sides and short sides;

and a contact angle of a material, for defining the long sides of the pixel regions, of the pixel defining layer is larger than a contact angle of a material, for defining the short sides of the pixel regions, of the pixel defining layer.

Optionally, in the display substrate provided by some embodiments of the present disclosure, the contact angle of the material, for defining the short sides of the pixel regions, of the pixel defining layer is 40°-55°,
the contact angle of the material, for defining the long sides of the pixel regions, of the pixel defining layer is 45°-60°.

Optionally, in the display substrate provided by some embodiments of the present disclosure, the pixel defining layer includes:
first pixel defining portions extending along the long sides of the pixel regions; and
second pixel defining portions located between adjacent first pixel defining portions and extending along the short sides of the pixel regions;
wherein a contact angle of the first pixel defining portions is larger than a contact angle of the second pixel defining portions.

Optionally, in the display substrate provided by some embodiments of the present disclosure, the pixel defining layer includes:
first pixel defining portions extending along the short sides of the pixel regions; and
second pixel defining portions located between the adjacent first pixel defining portions and extending along the long sides of the pixel regions;
wherein a contact angle of the first pixel defining portions is smaller than a contact angle of the second pixel defining portions.

Optionally, in the display substrate provided by some embodiments of the present disclosure, a material of the pixel defining layer is a fluorine-containing resin or a material containing hydrophobic nanoparticles.

Optionally, in the display substrate provided by some embodiments of the present disclosure, a material of the pixel defining layer is a mixture of a polyimide material and a polyvinylidene fluoride material,
a content of the polyvinylidene fluoride material in the mixture at the long sides of the pixel regions is 15-25%, and the content of the polyvinylidene fluoride material in the mixture at the short sides of the pixel regions is 10-20%.

Correspondingly, some embodiments of the present disclosure further provide a display device which includes any display substrate provided by some embodiments of the present disclosure.

Correspondingly, some embodiments of the present disclosure further provide a preparation method of a display substrate, including:
forming a pattern of a pixel defining layer for defining pixel regions on a base substrate, wherein pixel regions defined by the pixel defining layer have long sides and short sides, and a contact angle of a material, for defining the long sides of the pixel regions, of the pixel defining layer is larger than a contact angle of a material, for defining the short sides of the pixel regions, of the pixel defining layer.

Optionally, in the preparation method provided by some embodiments of the present disclosure, the forming the pattern of the pixel defining layer for defining the pixel regions on the base substrate includes:
forming a first material film layer on the base substrate;
patterning the first material film layer to form a plurality of strip-shaped first pixel defining portions; and
forming a plurality of second pixel defining portions arranged at intervals between adjacent first pixel defining portions, wherein the second pixel defining portions divide a space between every two adjacent first pixel defining portions into a plurality of pixel regions; when the first pixel defining portions extend along the long sides of the pixel regions and the second pixel defining portions extend along the short sides of the pixel regions, a contact angle of the first pixel defining portions is larger than a contact angle of the second pixel defining portions; and when the first pixel defining portions extend along the short sides of the pixel regions and the second pixel defining portions extend along the long sides of the pixel regions, the contact angle of the first pixel defining portions is smaller than the contact angle of the second pixel defining portions.

Optionally, in the preparation method provided by some embodiments of the present disclosure, the plurality of second pixel defining portions arranged at intervals are formed between the adjacent first pixel defining portions by ink jet printing.

DETAILED DESCRIPTION

Figure 1:
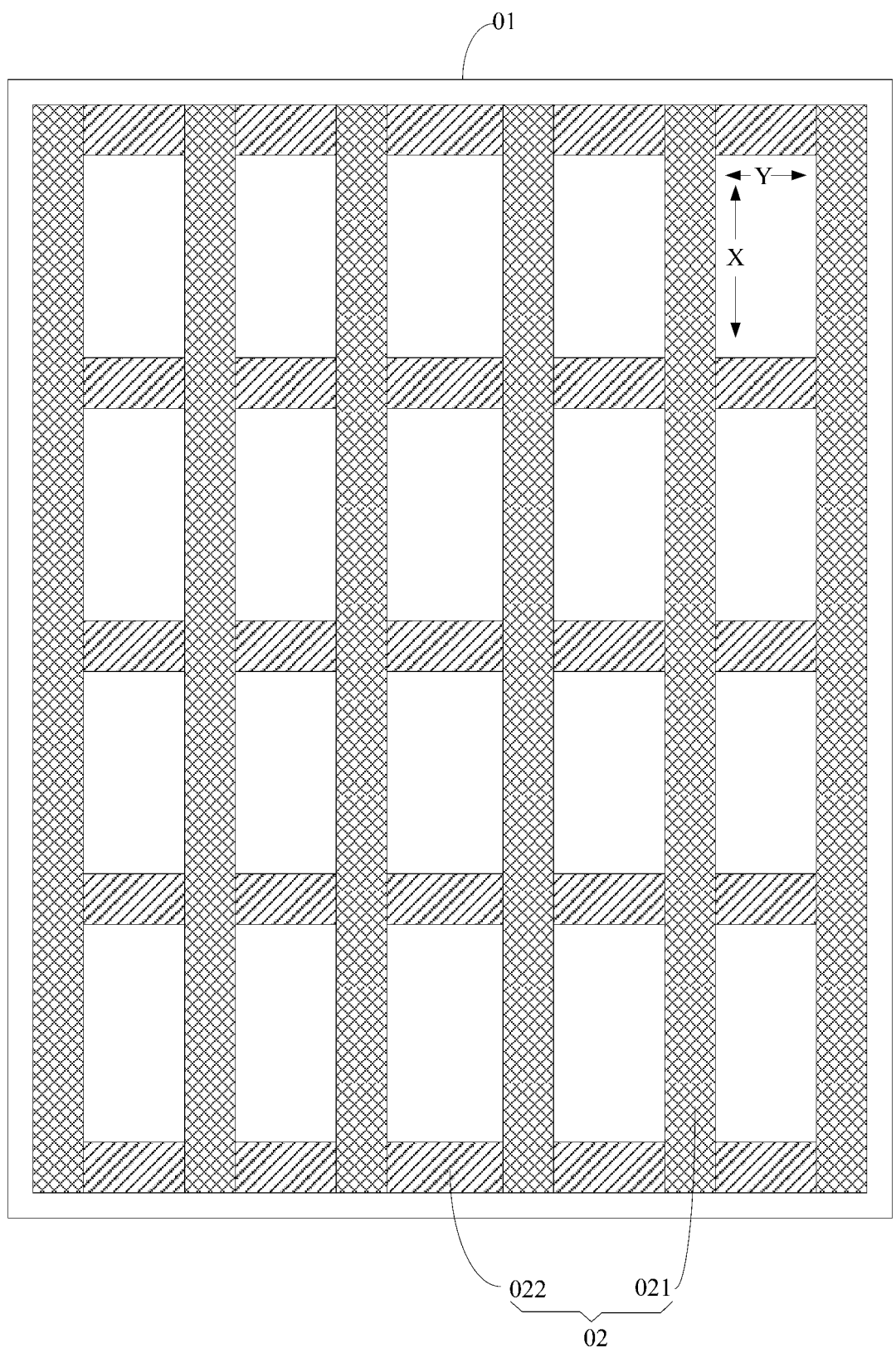
FIG. 1 is a first structural schematic diagram of a display substrate provided by some embodiments of the present disclosure.

In order to make the purpose, technical scheme and advantages of the present disclosure clearer, the present disclosure will be described in further detail below with reference to the accompanying drawings. Obviously, the described embodiments are only some embodiments of the present disclosure, not all embodiments. All other embodiments obtained by persons of ordinary skill in the art based on some embodiments of the present disclosure without creative efforts fall within the protection scope of the present disclosure.

The shapes and sizes of the components in the drawings do not reflect the true proportions, and the purpose is to schematically illustrate the present disclosure.

Figure 2:
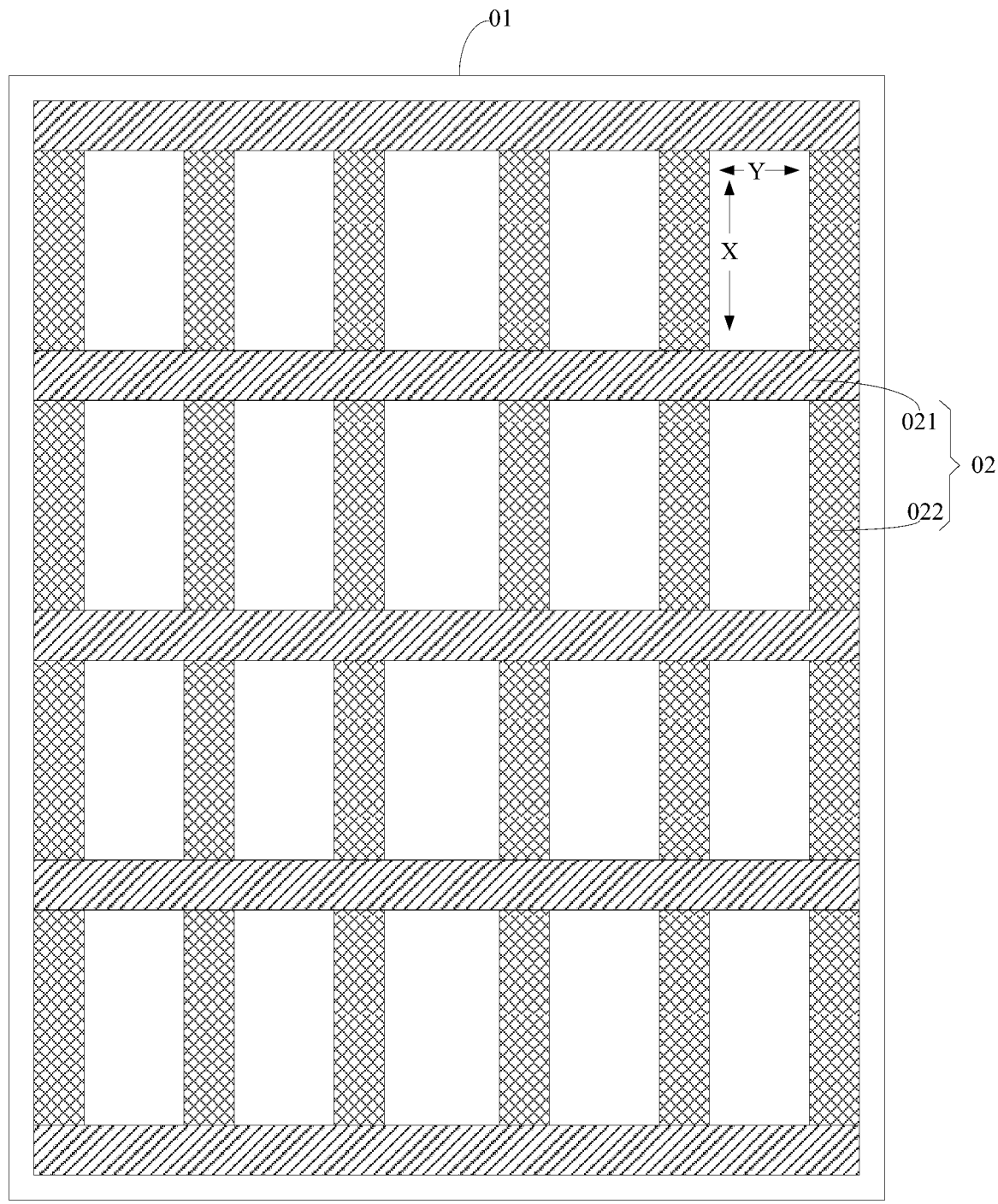
FIG. 2 is a second structural schematic diagram of a display substrate provided by some embodiments of the present disclosure.

A display substrate provided by some embodiments of the present disclosure, as shown in FIGS. 1 and 2, includes a base substrate 01 and a pixel defining layer 02 located on the base substrate 01, wherein each pixel region defined by the pixel defining layer 02 has a long side X and a short side Y.

A contact angle of a material, for defining the long sides X of the pixel regions, of the pixel defining layer 02 is larger than a contact angle of a material, for defining the short sides Y of the pixel regions, of the pixel defining layer 02.

Figure 3:
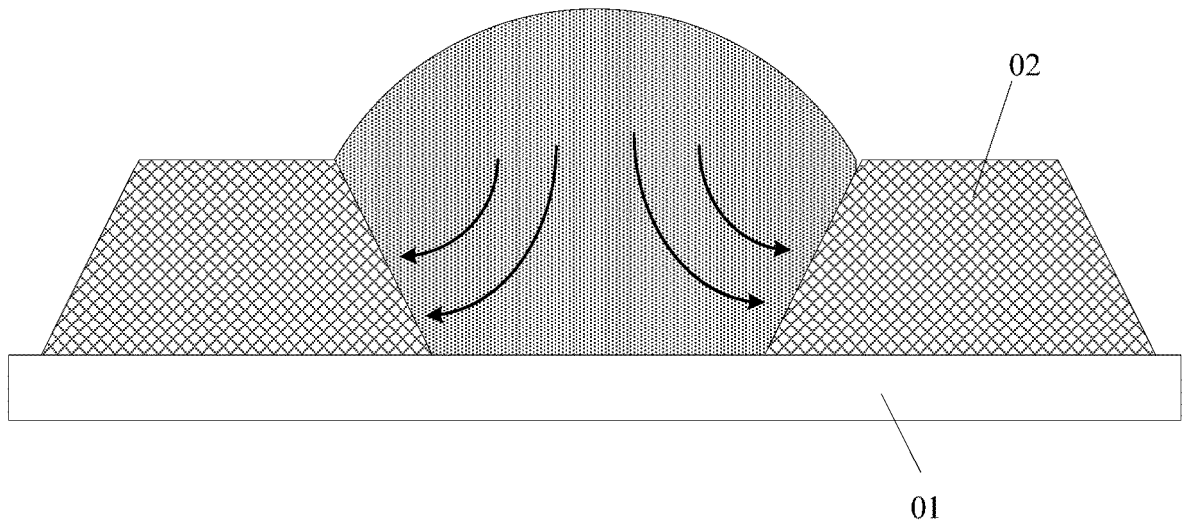
FIG. 3 is a schematic diagram of a capillary compensation phenomenon of ink in a pixel region according to some embodiments of the present disclosure.

In specific implementation, after ink drips into the pixel regions, in the drying process, due to the difference in solvent atmosphere between an edge region and a central region, evaporation rates are also different, resulting in a slight concentration difference; due to the concentration difference, a capillary compensation phenomenon as shown in FIG. 3 is generated inside liquid, that is, a solution in a middle part flows to an edge part; however, in an existing display substrate, since the distances between the central region and the edge region are different in a long side direction and a short side direction, the morphologies in the two directions are different. According to the display substrate provided by some embodiments of the present disclosure, the contact angle of the material, for defining the long sides of the pixel regions, of the pixel defining layer is larger than the contact angle of the material, for defining the short sides of the pixel regions, of the pixel defining layer, that is, a hydrophobicity of the pixel defining layer at the long sides of the pixel regions is stronger, so a resistance of the edge region to compensation liquid is large, and the liquid flows slowly; while the hydrophobicity of the pixel defining layer at the short sides of the pixel regions is weaker, so the resistance of the edge region to the compensation liquid is small, and the liquid flows fast; as a result, by making the pixel defining layer have different hydrophobicity corresponding to the long sides and the short sides, the compensation liquid can receive different resistances, resulting in different flow speeds, fast in a long side direction and slow in a short side direction, thus improving the uniformity of a film layer formed by ink droplets in the pixel region.

Optionally, in the display substrate provided by some embodiments of the present disclosure, as shown in FIG. 1, the pixel defining layer 02 includes:

first pixel defining portions 021 extending along the long sides X of the pixel regions; and second pixel defining portions 022 located between the adjacent first pixel defining portions 021 and extending along the short sides Y of the pixel regions;

wherein a contact angle of the first pixel defining portions 021 is larger than a contact angle of the second pixel defining portions 022.

Optionally, in the display substrate provided by some embodiments of the present disclosure, as shown in FIG. 2, the pixel defining layer 02 includes:

first pixel defining portions 021 extending along the short sides Y of the pixel regions; and second pixel defining portions 022 located between the adjacent first pixel defining portions 021 and extending along the long sides X of the pixel regions;

wherein a contact angle of the first pixel defining portions 021 is smaller than a contact angle of the second pixel defining portions 022.

Optionally, in the display substrate provided by some embodiments of the present disclosure, the contact angle of the material, for defining the short sides of the pixel regions, of the pixel defining layer is 40-55°, and the contact angle of the material, for defining the long sides of the pixel regions, of the pixel defining layer is 45-60°, which are not limited here.

In specific implementation, materials with appropriate contact angles can be selected empirically to make the first pixel defining portions and the second pixel defining portions respectively, or the contact angles of the pixel defining layer at the long sides and the short sides of the pixel regions can be adjusted empirically.

Optionally, in the display substrate provided by some embodiments of the present disclosure, the pixel defining layer may adopt the same material at the long sides and the short sides of the pixel regions, but with different hydrophobic component contents; or may adopt different materials to ensure different contact angles on both sides, which is not limited here.

Optionally, in the display substrate provided by some embodiments of the present disclosure, the pixel defining layer is made from fluorine-containing resin or a material containing hydrophobic nanoparticles.

In specific implementation, the fluorine-containing resin may be fluorine-containing polyimide, fluorine-containing polymethyl methacrylate, or the like, which is not limited here.

In specific implementation, the hydrophobic nanoparticles may be modified $SiO_2$ particles or the like, which is not limited here.

Optionally, in the display substrate provided by some embodiments of the present disclosure, the pixel defining layer is made from a mixture of a polyimide (PI) material and a polyvinylidene fluoride (PVDF) material, and the PI material and the PVDF material are combined into a fluorine-containing PI material in the form of chemical bonds or into a mixed film by electrostatic spinning.

Optionally, a content of the polyvinylidene fluoride material in the mixture at the long sides of the pixel regions is 15-25%, and the content of the polyvinylidene fluoride material in the mixture at the short sides of the pixel regions is 10-20%.

Based on the same inventive concept, some embodiments of the present disclosure further provide a display device which includes any display substrate provided by some embodiments of the present disclosure. The display device can be any product or component with a display function such as a mobile phone, a tablet computer, a television, a display, a notebook computer, a digital photo frame and a navigator. The implementation of the display device can be seen in some embodiments of the above-mentioned display substrate, and will not be repeated here.

Based on the same inventive concept, some embodiments of the present disclosure further provide a preparation method of a display substrate, including:

forming a pattern of a pixel defining layer for defining pixel regions on a base substrate, wherein each pixel region defined by the pixel defining layer has a long side and a short side, and a contact angle of a material, for defining the long sides of the pixel regions, of the pixel defining layer is larger than a contact angle of a material, for defining the short sides of the pixel regions, of the pixel defining layer.

Figure 4:
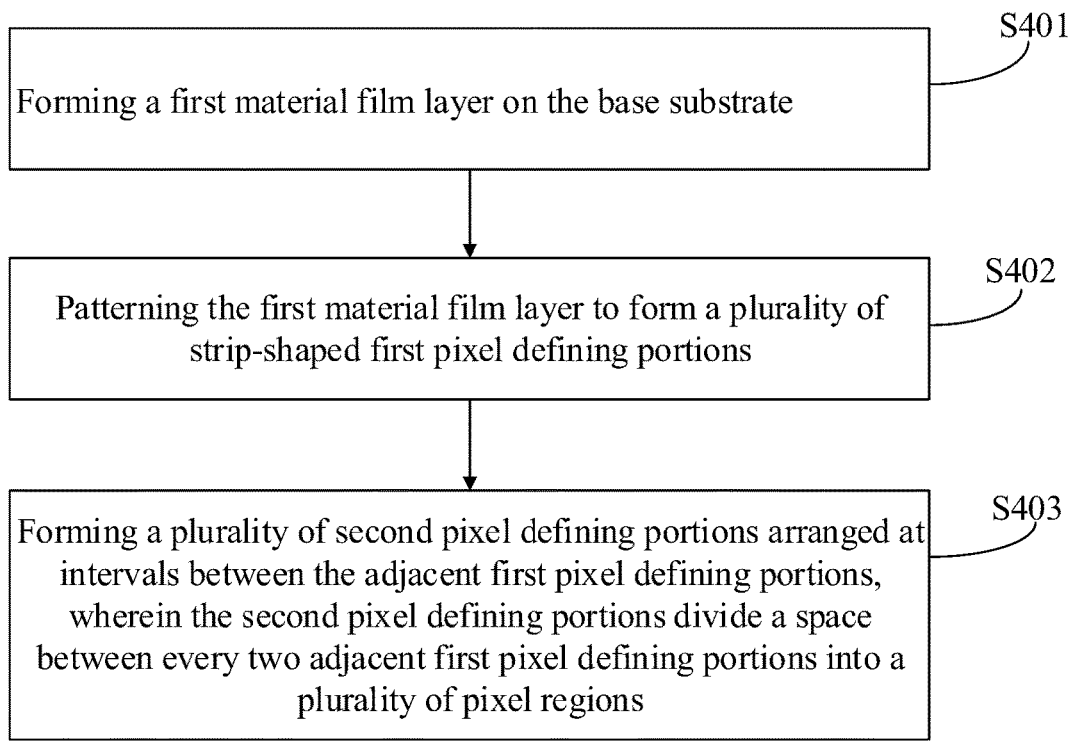
FIG. 4 is a flowchart of a preparation method of a display substrate provided by some embodiments of the present disclosure.
Figure 5A:
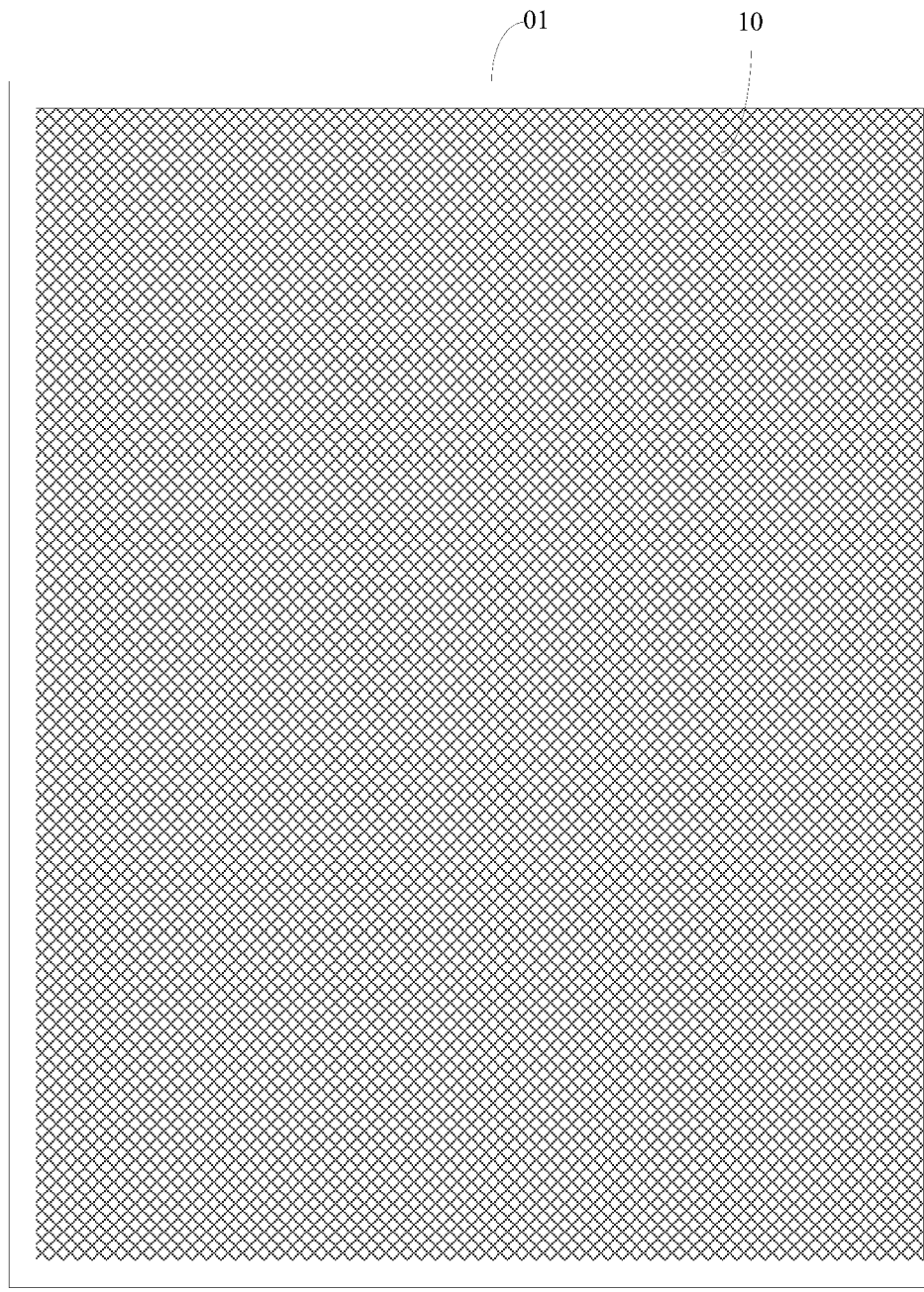
FIGS. 5A and 5B are respectively structural schematic diagrams corresponding to steps executed in the preparation method of the display substrate provided by some embodiments of the present disclosure.
Figure 5B:
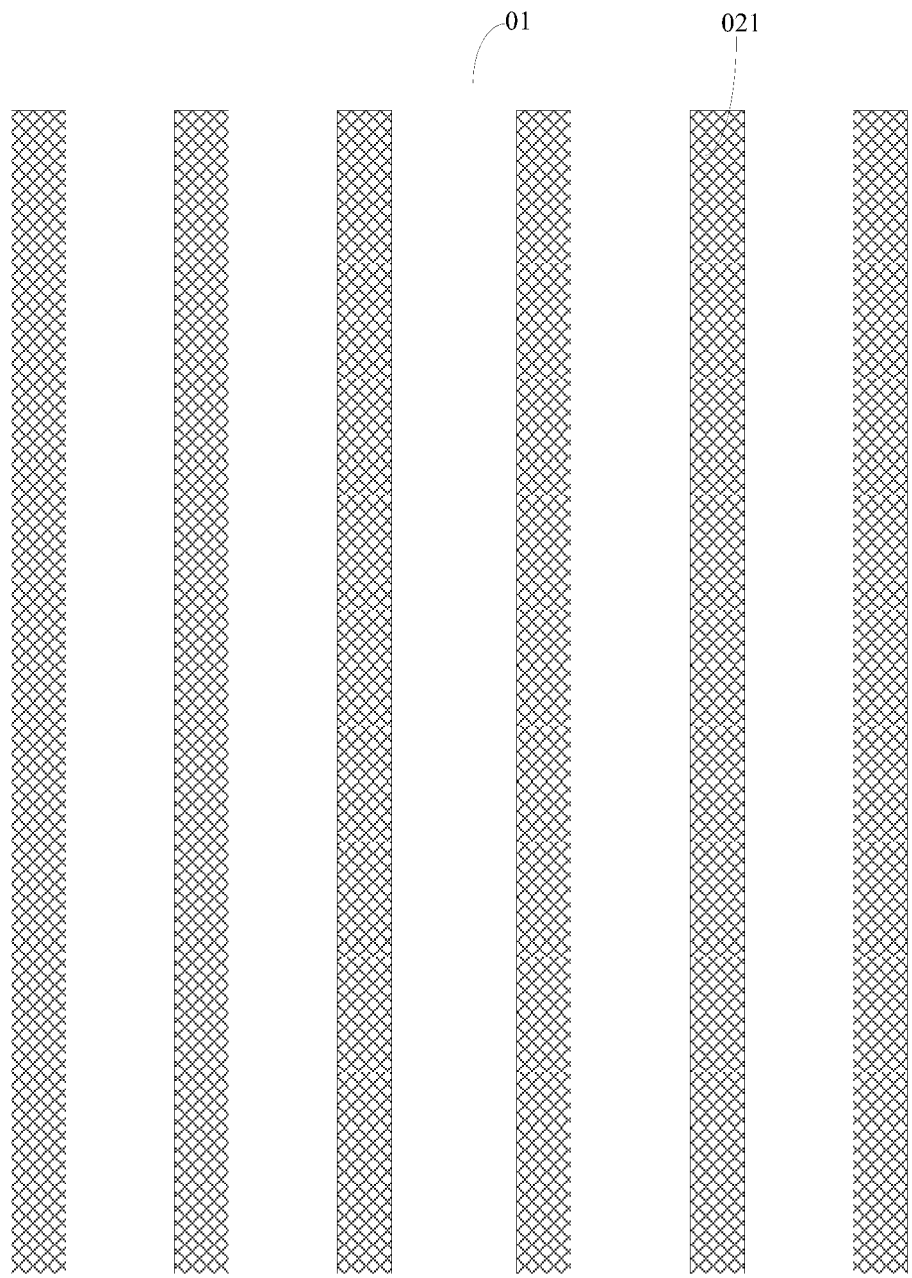

Optionally, in the preparation method provided by some embodiments of the present disclosure, as shown in FIG. 4, the step of forming the pattern of the pixel defining layer for defining the pixel regions on the base substrate specifically includes:

S401, forming a first material film layer 10 on the base substrate 01, as shown in FIG. 5A;

S402, patterning the first material film layer 10 to form a plurality of strip-shaped first pixel defining portions 021, as shown in FIG. 5B; and S403, forming a plurality of second pixel defining portions 022 arranged at intervals between the adjacent first pixel defining portions 021, wherein the second pixel defining portions 022 divide a space between every two adjacent first pixel defining portions 021 into a plurality of pixel regions, as shown in FIG. 1.

Optionally, when the first pixel defining portions extend along the long sides of the pixel regions and the second pixel defining portions extend along the short sides of the pixel regions, a contact angle of the first pixel defining portions is larger than a contact angle of the second pixel defining portions; and when the first pixel defining portions extend along the short sides of the pixel regions and the second pixel defining portions extend along the long sides of the pixel regions, the contact angle of the first pixel defining portions is smaller than the contact angle of the second pixel defining portions.

Optionally, in the preparation method provided by some embodiments of the present disclosure, the plurality of second pixel defining portions arranged at intervals are formed between the adjacent first pixel defining portions by ink jet printing.

The preparation method provided by some embodiments of the present disclosure will be described in detail below through a specific embodiment.

(1) The first material film layer is formed on the base substrate through spin coating, wherein during spin coating, a solid content of ink of the first material film layer is 5%-30%, a viscosity is in the range of 1.5-15 cp, and a rotation speed of spin coating is controlled to be 400-1300 rpm/s.

(2) Prebaking is conducted on the spin-coated first material film layer at 90° C.-120° C., wherein prebaking time is controlled to be 30-200 s.

(3) Postbaking is conducted at 90° C.-250° C., wherein postbaking time is controlled to be 10-120 min.

(4) The first material film layer is exposed and developed to form a pattern of the first pixel defining portions, wherein an exposure condition is controlled to be 20-250 mj, and development time is controlled to be 10-120 s.

(5) The plurality of second pixel defining portions arranged at intervals are formed between the adjacent first pixel defining portions by ink jet printing, wherein the solid content of the ink is 5%-30%, and the viscosity is in the range of 1.5-15 cp.

According to the display substrate, the preparation method of the display substrate and the display device provided by some embodiments of the present disclosure, the contact angle of the material, for defining the long sides of the pixel regions, of the pixel defining layer is larger than the contact angle of the material, for defining the short sides of the pixel regions, of the pixel defining layer, that is, a hydrophobicity of the pixel defining layer at the long sides of the pixel regions is strong, so a resistance of the edge region to compensation liquid is large, and the liquid flows slowly; while the hydrophobicity of the pixel defining layer at the short sides of the pixel regions is weak, so the resistance of the edge region to the compensation liquid is small, and the liquid flows fast; as a result, by making the pixel defining layer have different hydrophobicity corresponding to the long sides and the short sides, the compensation liquid can receive different resistances, resulting in different flow speeds, fast in a long side direction and slow in a short side direction, thus improving the uniformity of a film layer formed by ink droplets in the pixel region.

Obviously, those skilled in the art can make various changes and modifications to the disclosure without departing from the spirit and scope of the disclosure. Thus, if these modifications and variations of the disclosure fall within the scope of the claims of the disclosure and their equivalents, the disclosure is also intended to include such modifications and variations.

The invention claimed is:

1. A display substrate, comprising a base substrate and a pixel defining layer located on the base substrate, pixel regions defined by the pixel defining layer have long sides and short sides; wherein the pixel defining layer is configured to accommodate printing ink located in the pixel region;

the pixel defining layer comprises: first pixel defining portions extending along the long sides of the pixel regions; second pixel defining portions located between adjacent first pixel defining portions and extending along the short sides of the pixel regions; and a contact angle between the first pixel defining portions and the printing ink is larger than a contact angle between the second pixel defining portions and the printing ink;

the first pixel defining portions and the second pixel defining portions for defining a same pixel region enclose a closed rectangular pixel region;

a distance between a surface of the first pixel defining portion facing the base substrate and the base substrate is approximately equal to a distance between a surface of the second pixel defining portion facing the base substrate and the base substrate.

2. The display substrate according to claim 1, wherein the contact angle between the first pixel defining portions and the printing ink is 40°-55°;

and the contact angle between the second pixel defining portions and the printing ink is 45°-60°.

3. The display substrate according to claim 1, wherein a material of the pixel defining layer is a fluorine-containing resin or a material containing hydrophobic nanoparticles.

4. The display substrate according to claim 1, wherein a material of the pixel defining layer is a mixture of a polyimide material and a polyvinylidene fluoride material;
  a content of the polyvinylidene fluoride material in the mixture at the first pixel defining portion is 15-25%, and the content of the polyvinylidene fluoride material in the mixture at the second pixel defining portion is 10-20%.

5. A display device, comprising the display substrate according to claim 1.

6. The display device according to claim 5, wherein the contact angle between the first pixel defining portions and the printing ink is 40°-55°;
  and the contact angle between the second pixel defining portions and the printing ink is 45°-60°.

7. The display device according to claim 5, wherein a material of the pixel defining layer is a fluorine-containing resin or a material containing hydrophobic nanoparticles.

8. The display device according to claim 5, wherein a material of the pixel defining layer is a mixture of a polyimide material and a polyvinylidene fluoride material;
  a content of the polyvinylidene fluoride material in the mixture at the first pixel defining portion is 15-25%, and the content of the polyvinylidene fluoride material in the mixture at the second pixel defining portion is 10-20%.

9. A preparation method of the display substrate of claim 1, comprising:
  forming a pattern of a pixel defining layer for defining pixel regions on a base substrate, wherein the pixel regions defined by the pixel defining layer have long sides and short sides, and a contact angle of a material, for defining the long sides of the pixel regions, of the pixel defining layer is larger than a contact angle of a material, for defining the short sides of the pixel regions, of the pixel defining layer.

10. The preparation method according to claim 9, wherein the forming the pattern of the pixel defining layer for defining the pixel regions on the base substrate comprises:
  forming a first material film layer on the base substrate;
  patterning the first material film layer to form a plurality of strip-shaped first pixel defining portions; and
  forming a plurality of second pixel defining portions arranged at intervals between adjacent first pixel defining portions, wherein the second pixel defining portions divide a space between every two adjacent first pixel defining portions into a plurality of pixel regions; in a case of that the first pixel defining portions extend along the long sides of the pixel regions and the second pixel defining portions extend along the short sides of the pixel regions, a contact angle of the first pixel defining portions is larger than a contact angle of the second pixel defining portions; and in a case of that the first pixel defining portions extend along the short sides of the pixel regions and the second pixel defining portions extend along the long sides of the pixel regions, the contact angle of the first pixel defining portions is smaller than the contact angle of the second pixel defining portions.

11. The preparation method according to claim 10, wherein the plurality of second pixel defining portions arranged at intervals are formed between the adjacent first pixel defining portions by ink jet printing.

* * * * *